(12) United States Patent
Saouli et al.

(10) Patent No.: US 6,232,766 B1
(45) Date of Patent: *May 15, 2001

(54) TEST STATION FOR SEQUENTIAL TESTING

(75) Inventors: Mohamad Ali Saouli, Moreno Valley; Francesco Sacca, Rialto, both of CA (US)

(73) Assignee: GTE Communication Systems Corporation, Irving, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,795

(22) Filed: Dec. 31, 1997

(51) Int. Cl.[7] ................................ G01R 31/00
(52) U.S. Cl. .......................... 324/158.1; 324/754
(58) Field of Search ................. 324/158.1, 754, 324/755, 758

(56) References Cited

U.S. PATENT DOCUMENTS 5,614,819 * 3/1997 Nucci .......................... 324/158.1
5,680,936 * 10/1997 Beers ........................... 209/564
5,848,705 * 12/1998 Gianpaolo et al. ........ 324/158.1 X

* cited by examiner

*Primary Examiner*—Safet Metjahic
*Assistant Examiner*—T. R. Sundaram
(74) *Attorney, Agent, or Firm*—Leonard Charles Suchyta

(57) ABSTRACT

A test station for use with automated test equipment (ATE) in testing printed circuit boards (PCBs). The test station comprises a support frame to which are attached substantially identical test wells for sequentially performing tests on the PCBs. The test wells are attached to the frame through a mechanism that allows the test wells to be adjustably positioned between an idle position and a testing position that is in proximity with the ATE. Each of the test wells contains upper and lower conveyor segments and a test head disposed between the conveyor segments. The conveyor segments of the respective test wells variously align in accordance with vertical movement of the test wells so as to enable transverse movement of the PCBs into, through and out of the test station.

11 Claims, 5 Drawing Sheets

TEST STATION FOR SEQUENTIAL TESTING

FIELD OF THE INVENTION

The subject invention relates to testing of electronic circuitry and, more particularly, to an apparatus for sequentially performing testing at a first test station that operates in connection with automated test equipment.

BACKGROUND OF THE INVENTION

As the complexity of electronic equipment, especially computer-controlled or microprocessor-based, equipment, evolves, the requirements associated to testing such equipment escalate. Consequently, the direct and indirect costs of necessary test operations become a significant component of the cost of manufacturing or repairing the equipment. Testing costs may be manifest in numerous ways: the cost of acquiring and maintaining test equipment and test systems; the time occupied in performing testing procedures; and, less frequently recognized, the amount of manufacturing floor space occupied by the test equipment and system.

Accordingly, it is an object of this invention to provide a testing apparatus and method that readily accommodate the testing of various kinds of electronic equipment.

It is another object of this invention that the testing take advantage of proven, required or available automated test equipment (ATE).

It is a further object of this invention that the expense of acquiring and maintaining test equipment be minimized.

SUMMARY OF THE INVENTION

The above and other objects, advantages and capabilities are achieved in one aspect of the invention by test station for use with automated test equipment in testing printed circuit boards (PCBs). eThe test station comprises a support frame to which are attached substantially identical test wells for sequentially performing tests on the PCBs. The test wells are attached to the frame through a mechanism that allows the test wells to be adjustably positioned between an idle position and a testing position that is in proximity with the ATE. The test wells contain upper and lower conveyor segments and a test head disposed between the conveyor segments. The conveyor segments variously align in accordance with vertical movement of the test wells so as to enable transverse movement of the PCBs into, through and out of the test station.

BRIEF DESCRIPTION OF THE DRAWINGS

A thorough understanding of the present invention may be had by referring to the detailed Description when considered in connection with the Drawings described below, wherein like reference numbers refer to similar elements throughout, and wherein:

FIG. 3, including

BEST MODE FOR CARRYING OUT THE INVENTION

For a thorough understanding of the subject invention, reference is made to the following Description, in connection with the above described Drawings and the appended Claims.

Figure 1A:
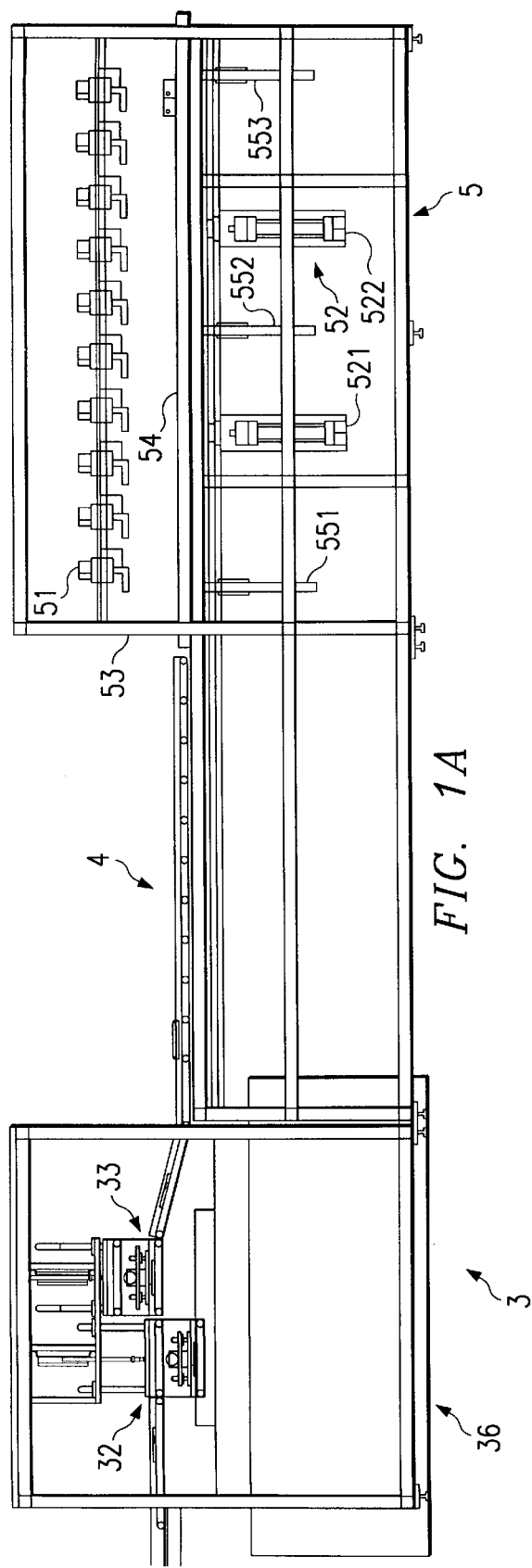
FIG. 1, including FIGS. 1A (side view) and 1B (top view), depict a test station 3 for performing sequential testing, a test station 5 for performing simultaneous testing, and a conveyor 4 interconnecting the two above-referenced test station.
Figure 1B:
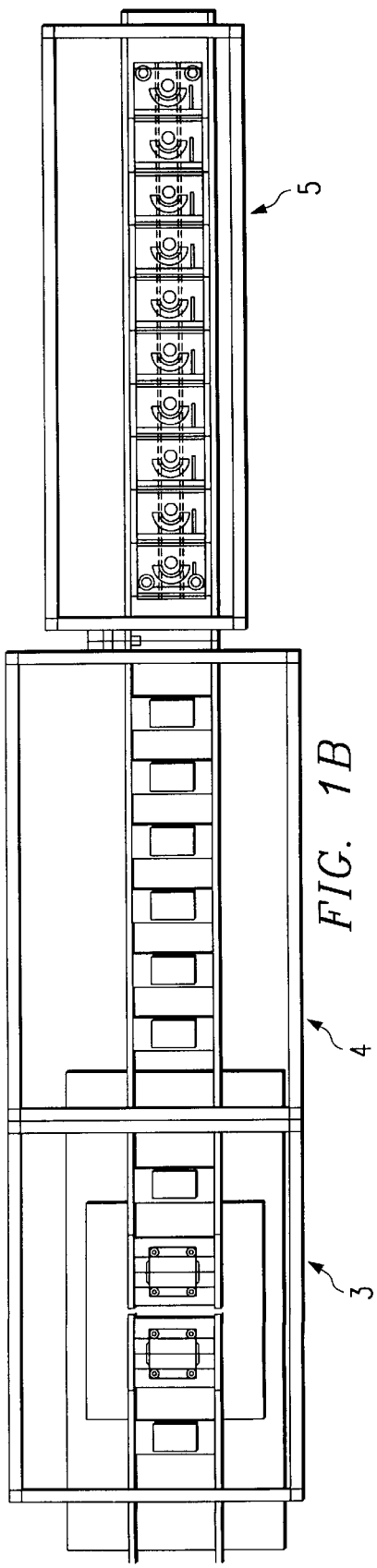

Attention is first directed to FIG. 1, including FIG. 1A (side view) and 1B (top view), which is an illustration of a test station to be used in connection with automated test equipment (ATE) for testing printed circuit boards (PCBs).

As depicted in FIG. 1, the test station includes a first test station 3 for use with ATE 36. Test station 3, more fully described below, includes dual test wells 32 and 33 that are used to facilitate sequential testing of PCBs via ATE 36. Test station 3 is connected, via an interconnection conveyor 4, to a second test station 5. At test station 5, a predetermined number of PCBs are loaded into the test station and are simultaneously tested. In accordance with the embodiment of the invention contemplated here, test station 3 facilitates an "in-circuit," or continuity, test of the PCBs, and test station 5 facilitates a functional test of the PCBs.

As an operation preliminary to the testing of PCBs at test station 3, the PCBs are reorientated from the orientation at which they had been proceeding on the test line to the orientation in concinnity with the ATE. In this regard, it is to be understood that the PCBs generally travel in a linear path through the ATE and various associated test stations. Because it is desirable to maintain this path of travel, and because transport or testing prior to station 3 renders the PCBs in an orientation that discommodes testing at test station 3, it is required that the PCBs be reorientated prior to their application to station 3.

Figure 2:
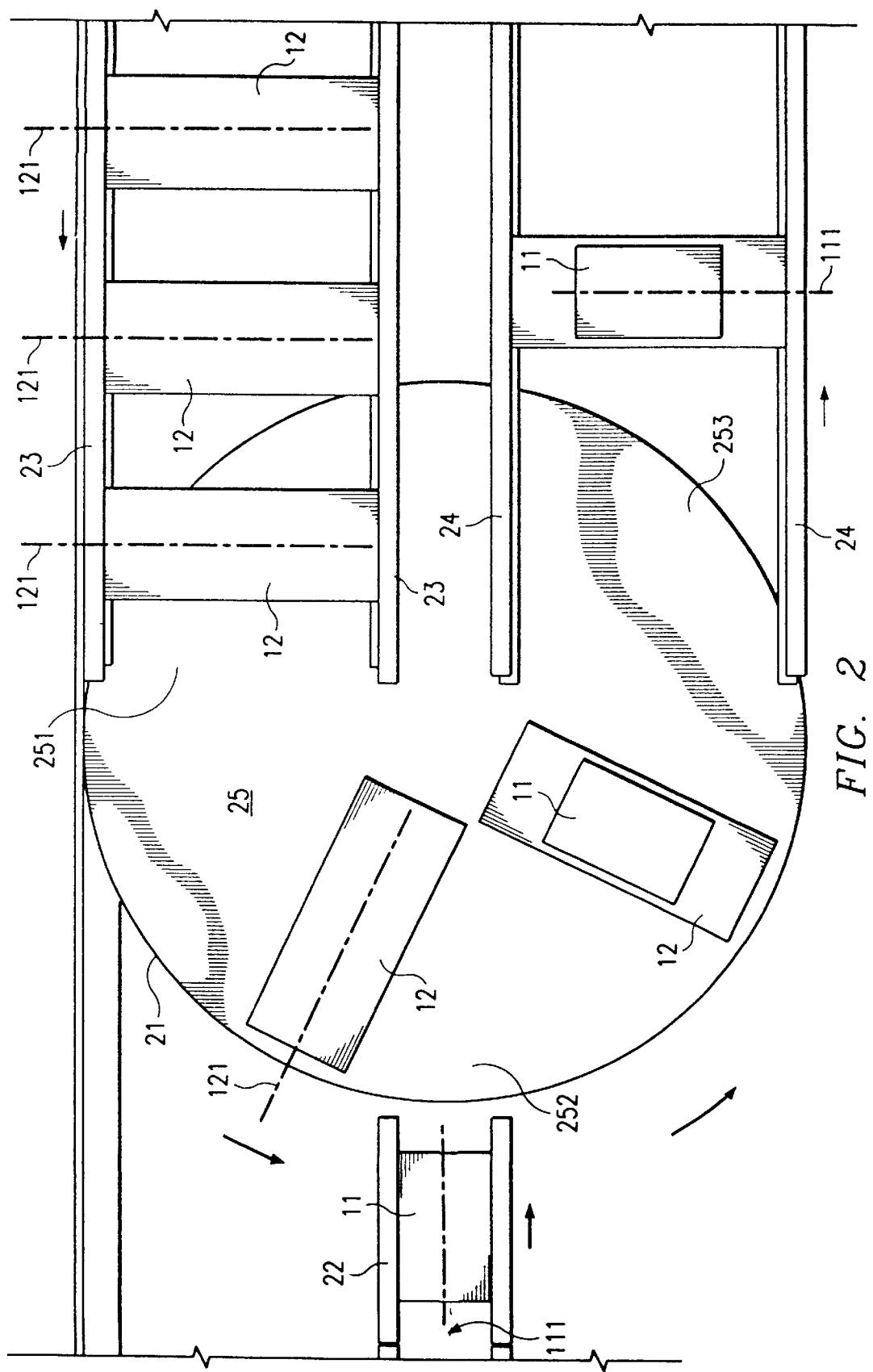
FIG. 2 is a top view of a reorienting apparatus that reorients printed circuit boards for proper alignment with the test stations and automated test equipment associated therewith.

Accordingly, it is an aspect of this subject invention to provide a novel reorienting apparatus, and such is depicted in FIG. 2.

Referring now to FIG. 2, depicted therein is an apparatus for reorienting printed circuit boards (PCBs) to an input of automated test equipment (ATE) for various tests to be conducted on the PCBs. As shown in FIG. 2, the PCBs 11 are initially oriented with a major axis 111 orientated in a horizontal direction, that is, along the direction of travel of a conveyor 22. With respect to the embodiment of the invention illustrated in FIG. 2, conveyor 22 transports PCBs 11 in a left-to-right (east-to-west) direction. Similarly, a second conveyor 23 transports rectangular pallets 12 in the opposite direction. Pallets 12 have a major axis 121 oriented in a direction orthogonal to the direction of travel of conveyor 23. As illustrated in the embodiment of FIG. 2, conveyor 23, and, concomitantly, pallets 12 travel in a right-to-left (east-to-west) direction.

As may be seen from FIG. 2, conveyor 23 deposits pallets 12 at a first position on a rotating table 25. Table 25 may rotate in a counterclockwise fashion. Similarly, conveyor 22 deposits the PCBs at a position 252 on the rotation table 25. Pallets 12 are rotated through an angle of approximately 90° from position 251 to position 252. At position 252, pallets 12 are merged with PCBs 11 so that the PCBs are supported by the upper surface of the pallets. Subsequently, the merged PCBs and pallets are rotated, in a counterclockwise direction, through a radial angle of approximately 90°, where they are delivered to a conveyor 24 that transports the palletized PCBs to an input of the ATE. Conveyor 24 travels in a direction parallel to, but opposite from, the direction of travel conveyor 23. In a manner described above, the PCBs are reorientated, specifically, major axis 111 is rotated through an angle of 90°, which maintains the direction of travel of the PCBs, while effecting the proper orientation to the input of the ATE shown in FIG. 3.

Referring now to FIG. 2A, depicted therein is a test station 3 for use with ATE, which, in an exemplary embodiment may be a Model HP-3070, available from Hewlett Packard Company. In a manner that will be apparent from the description below, the test station operates in conjunction with the ATE to sequentially perform tests on PCBs 11. The PCBs are transported to test station 3 from the reorienting apparatus described above and illustrated in FIG. 2.

Figure 3A:
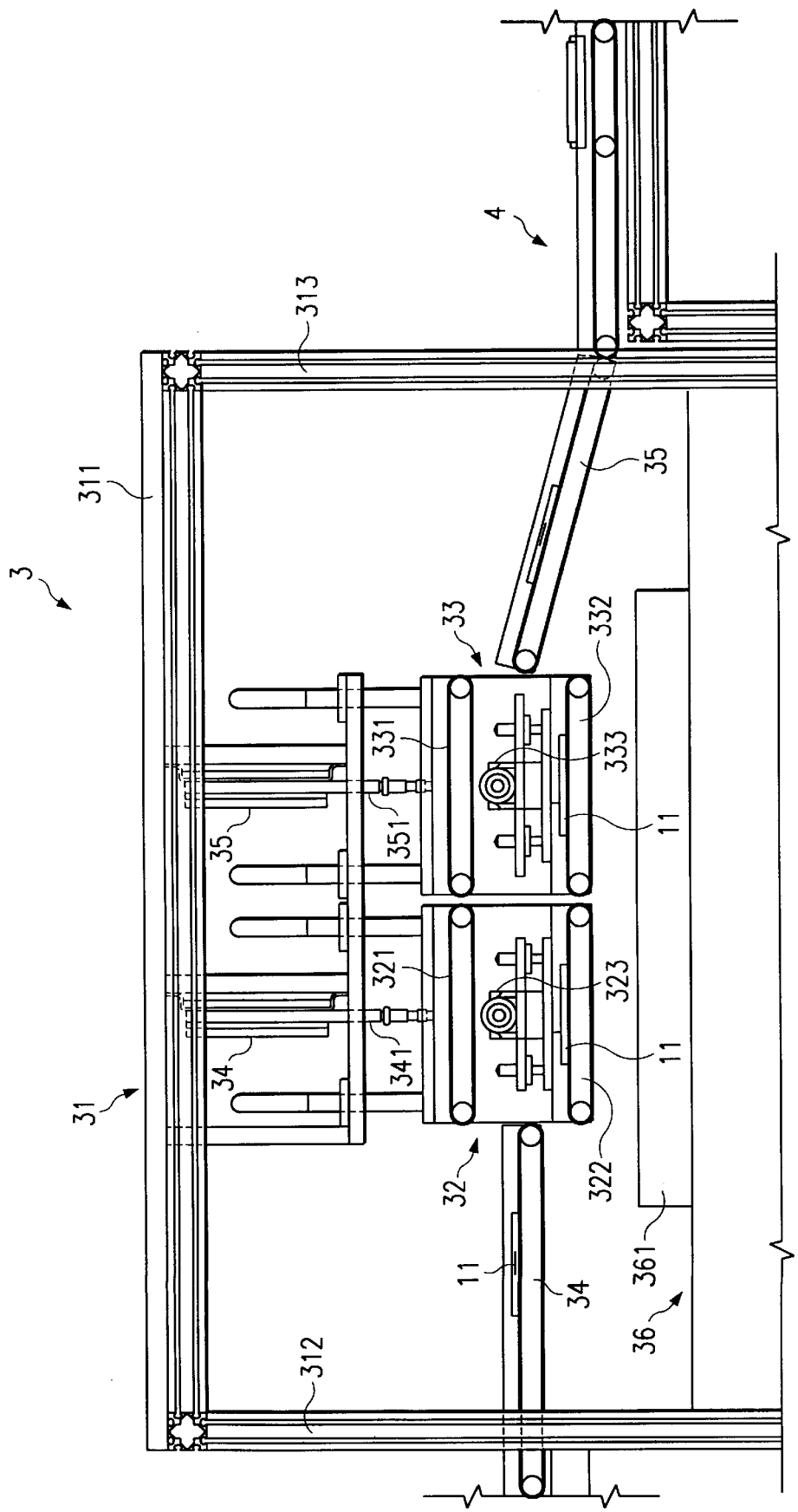
FIGS. 3A, 3B and 3C, depict test station 3 in various phases of sequential testing.

Test station 3 comprises a support frame 31 having a roof 311 and upright members 312 and 313. The support frame 31 supports and, to a degree, encloses a pair of substantially identical test wells 32 and 33. The test wells include respective upper conveyor segments 321 and 331, respective lower conveyor segments 322 and 332, and respective test heads 323 and 333. As shown in FIG. 3, the test heads are disposed in the test wells between the upper conveyor segments and the lower conveyor segments. The specific constituent components of the test head are not germane to the invention. Suffice it to say that the test head contain active or passive circuitry necessary to perform the tests to be performed on the PCBs. The tests here, then, are designed in response to the design of the PCBs.

The test wells are themselves coupled to roof 311 by pneumatic actuators 34 and 35. The actuators include respective vertically orientated rods 341 and 351 that are attached to test wells 32 and 33 and operate to move the test wells between an idle position in the direction of roof 311 and a testing position in proximity with the ATE.

Test station 3 also includes an input conveyor segment 34 for transporting PCBs to the test wells and an output conveyor segment for removing tested PCB from the test well.

Figure 3B:
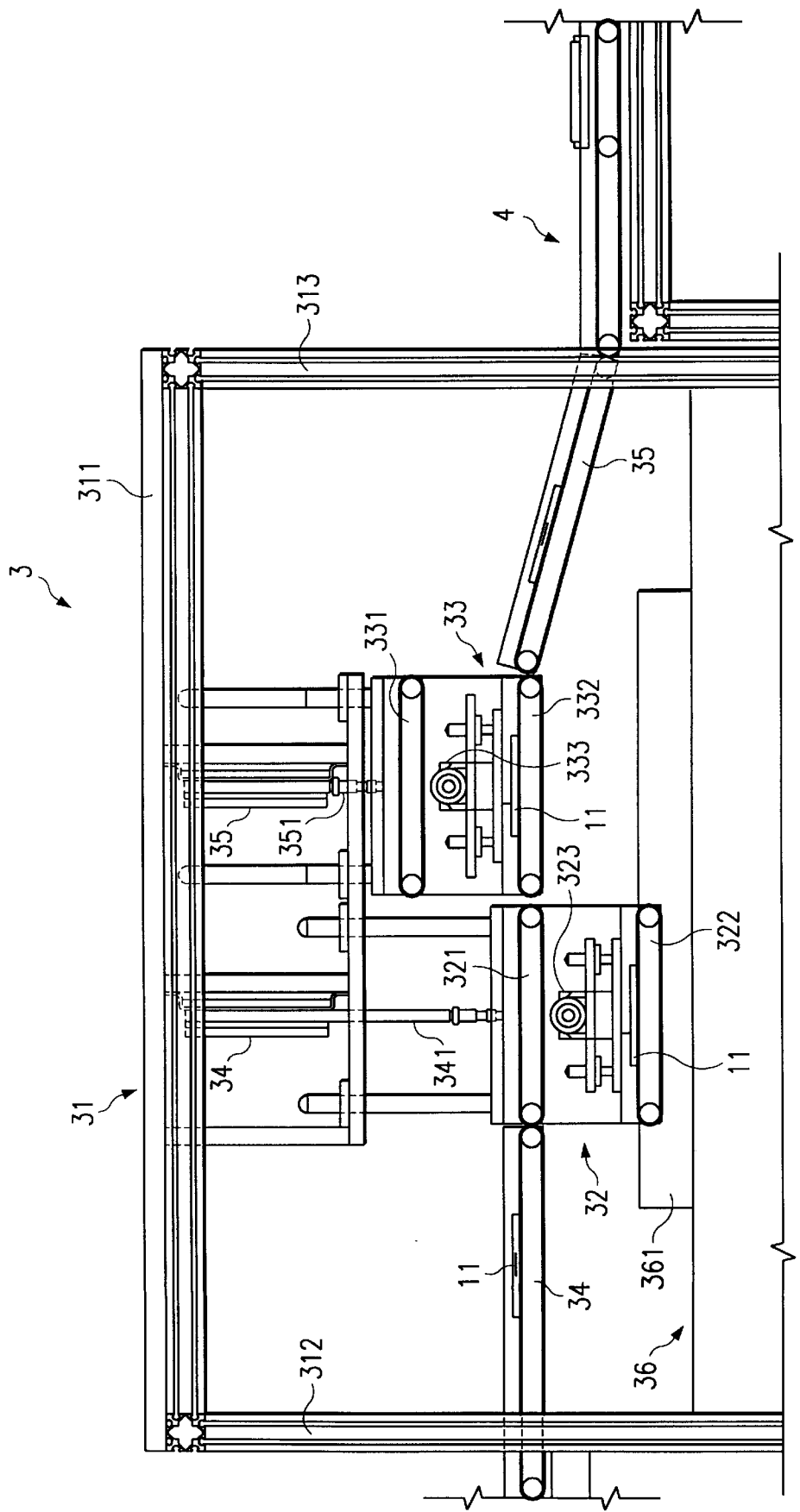

Test wells 32 and 33 are operated to sequentially test PCBs in the manner described immediately below. FIG. 3B depicts a phase of the testing cycle in which test well 32, by virtue of extension of rod 341, is disposed in a testing position, that is, in proximity with test platform 361 of the ATE. In this phase of the test cycle test well 33 is raised to a position in the direction of roof 311. Accordingly, input conveyor segment 34, upper conveyor segment 321 of test well 32, lower conveyor segment 332 of test well 33, and output conveyor segment 35 are in alignment.

Figure 3C:
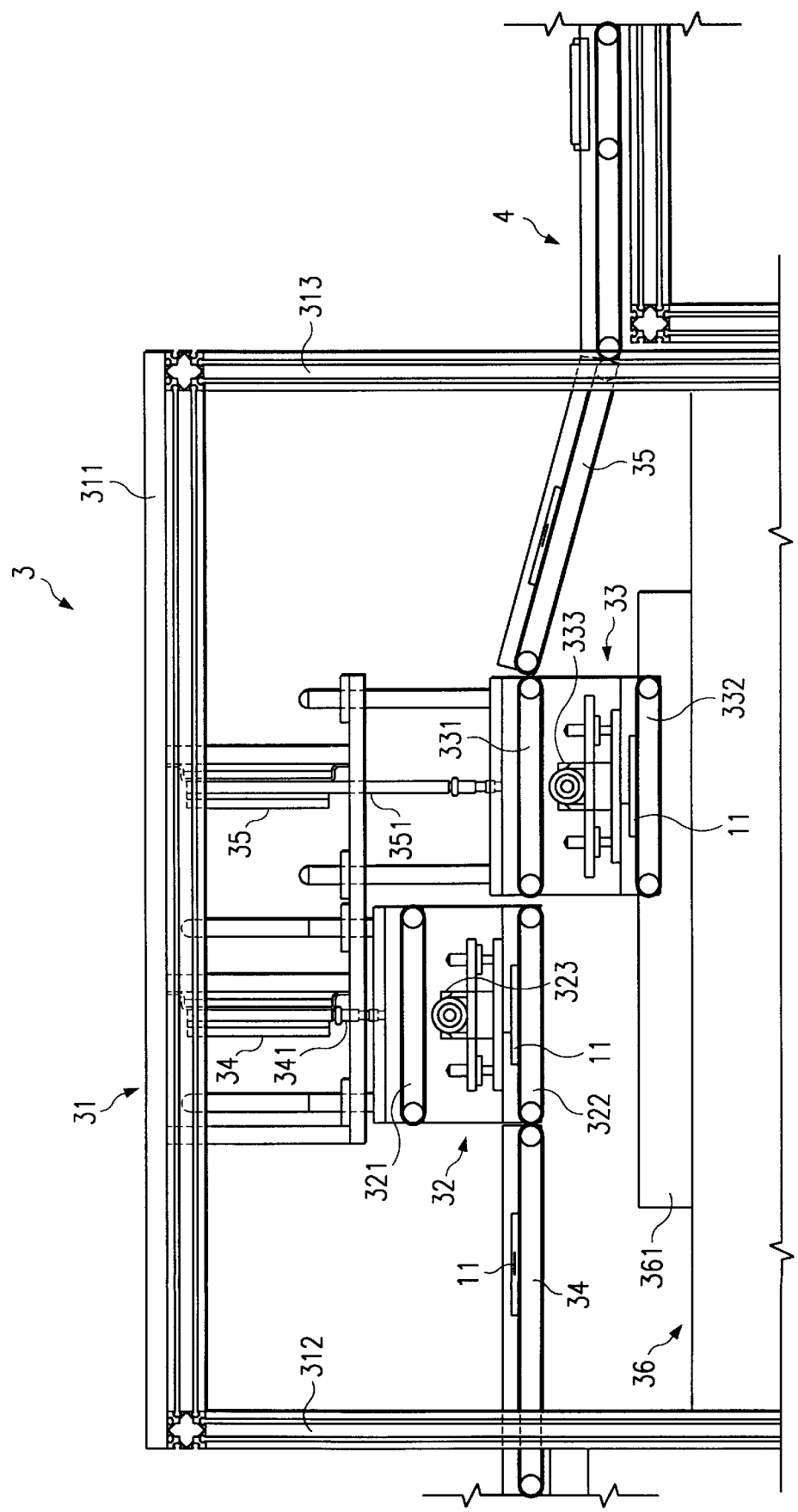

In another phase of the testing cycle, depicted in FIG. 3C, in which test well 33 is disposed in the testing position and test well 32 is raised to the idle position. In this phase input conveyor segment 34, lower conveyor or segment 322 of test well 32, upper conveyor segment 331 of test well 33, and output conveyor segment 35 are in alignment. Accordingly, the PCB positioned in test well 33 is disposed in proximity with platform 361 for testing by ATE. In the course of testing by test well 33, the PCB tested immediately previously by test well 32 is transported from conveyor segment 322, across conveyor segment 331, to output conveyor segment 35. Output conveyor segment 35 delivers PCBs to the interconnection conveyor.

Sequential testing of PCBs in test station 3 occurs as follows. Assume, for pedagogical purposes, that both test wells 32 and 33 are initially raised to the idle position. A PCB is transported from input conveyor segment 34 to lower conveyor segment 322 of test well 32. Test well 32 is lowered to the testing position, and another PCB may be transported from input conveyor segment 34, across upper conveyor segment 332 of test well 33. After testing by the ATE of the PCB in test well 32, test well 32 is raised to the idle position, and test well 33 is lowered to the testing position. With test well 33 in the testing position, the PCB in test well 32 is transported by conveyor segment 322, across conveyor segment 331 to output segment 35, and is removed from test station 3. After testing is completed on the PCB in test well 33, test well 33 is raised to the idle position, and the PCB in test well 33 is transported by conveyor segment 332 to output conveyor 35.

Referring once more to FIG. 1, upon being discharged from test station 3, PCB are concatenated on interconnecting conveyor 5. In a preferred embodiment of the invention, concatenation of PCBs on conveyor 5 is achieved by interlocking the pallets on which the PCBs are transported. Specifically, because in a specific embodiment of the invention, the duration of testing at test station 3 is shorter than the duration of testing at a subsequent test station 5, a predetermined number of PCBs may be concatenated for simultaneous test (described below) at station 5. The predetermined number compensates for the difference in the duration of testing at the two test stations.

We claim:

1. An automated test equipment (ATE) test station for sequentially testing printed circuit boards (PCBs), the test station comprising:

a support frame;

first and second test wells moveably attached to the support frame wherein each of the test wells comprises an upper conveyor segment, a lower conveyor segment, and a test head disposed between the upper conveyor segment and the lower conveyor segment; and means coupled between the support frame and each of the test wells for sequentially positioning the test wells at and between an idle position and a testing position.

2. A test station as defined in claim 1, further comprising an input conveyor segment for transporting PCBs to the test wells and an output conveyor segment for transporting PCBs away from the test station.

3. A test station as defined in claim 2, wherein the first test well is positioned in the idle position and the second test well is positioned in the testing position so that (i) the input conveyor segment, the lower conveyor segment of the first test well, the upper conveyor segment of the second test well, and the output conveyor segment are substantially aligned and (ii) a PCB contained in the second test well is disposed in proximity with the ATE for testing.

4. A test station as defined in claim 2 wherein the second test well is positioned in the idle position and the first test well is positioned in the testing position so that (i) the input conveyor segment, the upper conveyor segment of the first test well, the lower conveyor segment of the second test well, and the output conveyor segment are substantially aligned and (ii) a PCB contained in the first test well is disposed in proximity with the ATE for testing.

5. A test station as defined in claim 2 wherein the means for sequentially positioning the test wells comprises an actuator coupled to each of the test wells, the actuator having a vertically disposed rod attached to each of the test wells for moving the test wells vertically between the idle position and the testing position.

6. A test station as defined in claim 5, wherein the first test well is positioned in the idle position and the second test well is positioned in the testing position so that (i) the input conveyor segment, the lower conveyor segment of the first test well, the upper conveyor segment of the second test well, and the output conveyor segment are substantially aligned and (ii) a PCB contained in the second test well is disposed in proximity with the ATE for testing.

7. A test station as defined in claim 5, wherein the second test well is positioned in the idle position and the first test well is positioned in the testing position so that (i) the input conveyor segment, the upper conveyor segment of the first test well, the lower conveyor segment of the second test well, and the output conveyor segment are substantially aligned and (ii) a PCB contained in the first test well is disposed in proximity with the ATE for testing.

8. A test station including automated test equipment (ATE) for testing printed circuit boards (PCBs), the test station comprising:

(a) a support frame;

(b) first and second test wells each attached to the support frame in a manner that allows the respective test well to be moved sequentially and independently between a respective idle position and a respective testing position, each of the test wells comprising:
 (i) an upper conveyor segment;
 (ii) a lower conveyor segment; and
 (iii) a test head disposed between the upper conveyor segment and the lower conveyor segment; and (c) actuators coupled to the support frame and to each of the test wells for moving the test wells between the respective idle positions and testing positions.

9. A test station as defined in claim 8, further comprising an input conveyor segment coupled to the test wells for transporting PCBs to the test wells and an output conveyor segment coupled to the test wells for removing PCBs from the test station.

10. A test station as defined in claim 9, wherein the first test well is positioned in the idle position and the second test well is positioned in the testing position so that (i) the input conveyor segment, the lower conveyor segment of the first test well, the upper conveyor segment of the second test well, and the output conveyor segment are substantially aligned and (ii) a PCB contained in the second test well is disposed in proximity with the ATE for testing.

11. A test station as defined in claim 9, wherein the first test well is positioned in the testing position and the second test well is positioned in the idle position so that (i) the input conveyor segment, the upper conveyor segment of the first test well, the lower conveyor segment of the second test well, and the output conveyor segment are substantially aligned and (ii) a PCB in the first test well is disposed in proximity with the ATE for testing.

* * * * *